(12) United States Patent
Unterberger

(10) Patent No.: US 7,126,253 B2
(45) Date of Patent: Oct. 24, 2006

(54) REACTANCE FILTER HAVING AN IMPROVED EDGE STEEPNESS

(75) Inventor: Michael Unterberger, Unterhaching (DE)

(73) Assignee: Epcos AG, Munich (DE)

( * ) Notice: Subject to any disclaimer, the term of this patent is extended or adjusted under 35 U.S.C. 154(b) by 236 days.

(21) Appl. No.: 10/483,928

(22) PCT Filed: May 16, 2002

(86) PCT No.: PCT/DE02/01761

§ 371 (c)(1),
(2), (4) Date: Aug. 23, 2004

(87) PCT Pub. No.: WO03/009470

PCT Pub. Date: Jan. 30, 2003

(65) Prior Publication Data

US 2004/0263286 A1    Dec. 30, 2004

(30) Foreign Application Priority Data

Jul. 18, 2001  (DE) ............................... 101 34 987

(51) Int. Cl.
*H03H 9/58* (2006.01)
*H01L 41/107* (2006.01)
(52) U.S. Cl. ................. 310/320; 333/187; 333/189
(58) Field of Classification Search ............. 310/320; 333/187, 189

See application file for complete search history.

(56) References Cited

U.S. PATENT DOCUMENTS 6,246,302 B1   6/2001   Müller et al.

FOREIGN PATENT DOCUMENTS

| DE | 196 38 451 | | 4/1998 | |
|----|-----------|--|--------|--|
| JP | 55-127719 | * | 10/1980 | ................. 333/189 |
| JP | 55-127720 | * | 10/1980 | ................. 333/189 |

OTHER PUBLICATIONS

Abstract of JP 63 253711 (Oct. 20, 1988) *Patent Abstracts of Japan* vol. 013, No. 068 (E-716), Feb. 16, 1989.
Lakin et al "Development of Miniature Filters for Wireless Applications", *Microwave Symposium Digest, IEEE MTT-S International 1995*, pp. 883-886.

* cited by examiner

*Primary Examiner*—Thomas M. Dougherty
(74) *Attorney, Agent, or Firm*—Schiff Hardin LLP

(57) ABSTRACT

A reactance filter, which is constructed from BAW resonators, has at least one basic element that has a first resonator in a first branch and a second resonator in a second branch. In one branch, there is situated a resonator having a greater ratio of dynamic to static capacitance than in the second branch, so that a filter is obtained having a resulting passband in which one edge is set steeper than the other edge. The selection of the edge that is to be set steeply takes place through the allocation of the first branch to the serial or to the parallel branch.

14 Claims, 8 Drawing Sheets

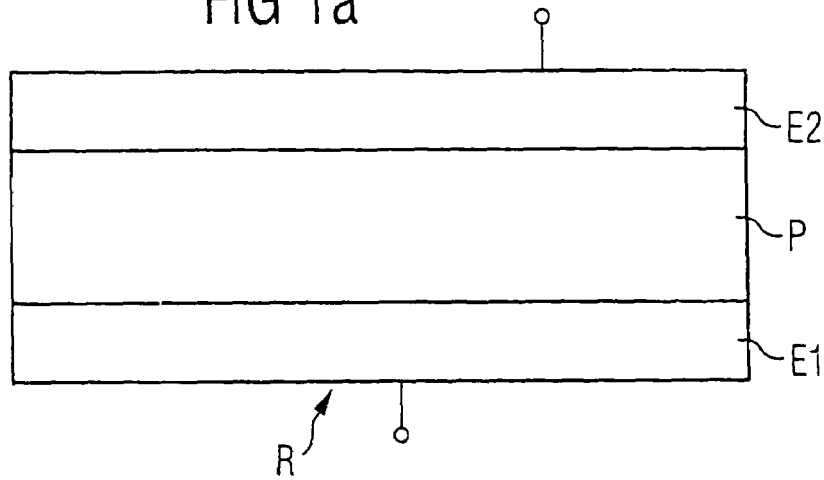
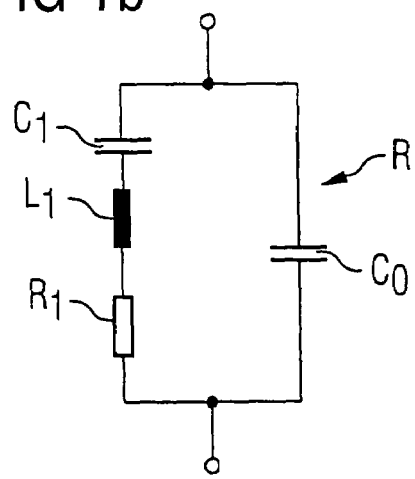
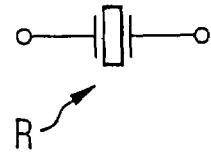
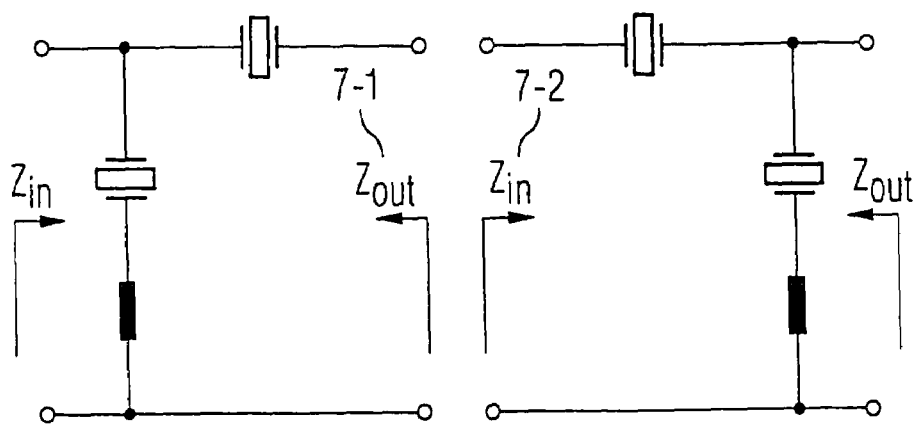

Notation:

p-s-s-p-p-s p: parallel resonator
s: serial resonator

Notation:

s-p-p-s-s-p-p-s p: parallel resonator
s: serial resonator

Notation:

p-s-p-s p: parallel resonator
s: serial resonator

Notation:

s-p-s-p-s p: parallel resonator
s: serial resonator

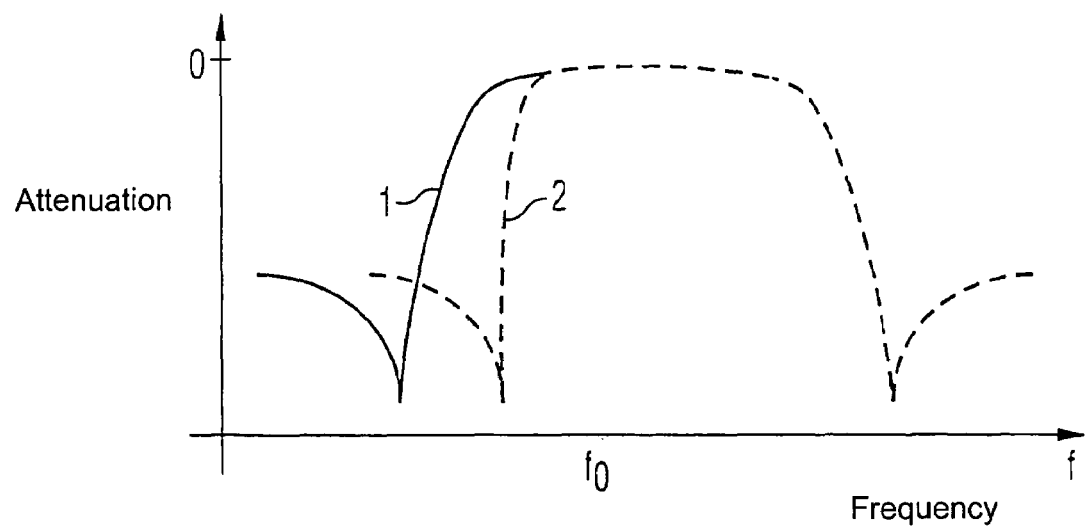
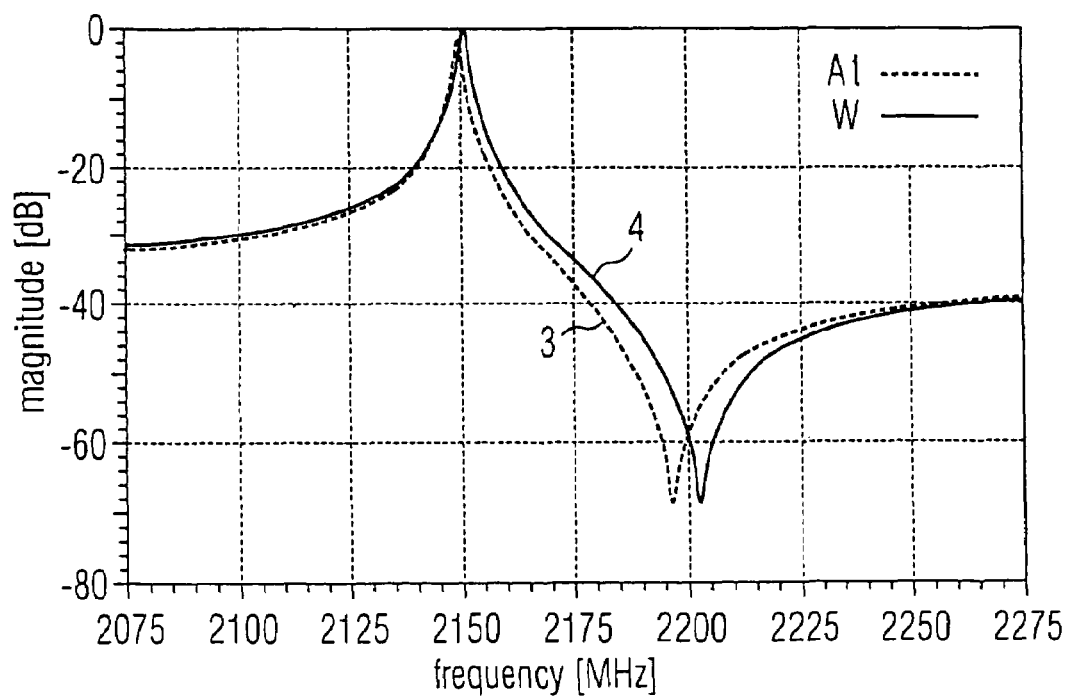

REACTANCE FILTER HAVING AN IMPROVED EDGE STEEPNESS

BACKGROUND OF THE INVENTION

The present invention relates to bulk acoustic wave filters (also known as BAW filters) that are constructed according to the reactance filter principle.

From an article by K. M. Lakin et al. in Microwave Symposium Digest, IEEE MTT-S International 1995, pp. 883–886, it is known to construct reactance filters from BAW resonators. Here, these resonators are used as impedance elements, and are for example wired or connected to form ladder-type or lattice filters. This type of wiring for the manufacture of filters is also known as branching technology.

According to FIG. 1a, in its simplest specific embodiment a BAW resonator R is made up of a thin film P of a piezoelectric material, which is provided with an electrode E1, E2 on its upper and lower side respectively. Ideally, this structure is surrounded by air on both electrode sides. When an electrical voltage is applied to the electrodes, an electrical field acts on the piezoelectric layer, with the result that the piezoelectric material converts a part of the electrical energy into mechanical energy in the form of acoustic waves. These waves propagate parallel to the field direction, as what are known as bulk waves, and are reflected at the electrode/air boundary surfaces. At a particular frequency $f_r$, which is dependent on the thickness of the piezoelectric layer or on the thickness of the bulk resonator, the resonator exhibits a resonance, and thus behaves like an electrical resonator.

In the equivalent circuit diagram according to FIG. 1b, the BAW resonator R is made up of a series resonance circuit of dynamic inductance L1, dynamic capacitance C1, and dynamic resistance R1, as well as a static capacitance C0, connected thereto in parallel. The series resonance circuit reproduces the behavior of the resonator in the resonance case, i.e., in the range of resonance frequency $f_r$. Static capacitance C0 reproduces the behavior in the range $f<<f_r$ and $f_r>>f$. Dynamic capacitance C1 is thereby proportional to the static capacitance C0 of the BAW resonator.

$$C1 \sim C0. \quad (1.1)$$

For the resonance frequency $f_r$ and the anti-resonance frequency $f_a$ of a BAW resonator, the following hold:

$$f_r = \frac{1}{2\pi\sqrt{L1 \cdot C1}} \text{ and} \quad (1.2)$$

$$f_a = f_r\sqrt{1 + \frac{C1}{C0}}. \quad (1.3)$$

According to FIG. 7, a reactance filter is made up of at least one basic element that has a serially connected resonator R2 having a resonance frequency $f_{rs}$ and an associated anti-resonance frequency $f_{as}$, and that has a second resonator R1 that is connected parallel to a second terminal, in particular parallel to ground, having a resonance frequency $f_{rp}$ and an associated anti-resonance frequency $f_{ap}$. In order to produce a filter having a bandpass characteristic and a center frequency $f_0$, the following relation holds for the two resonators in the serial or in the parallel branch:

$$f_{ap} \approx f_{rs} \approx f_0 \quad (1.4).$$

FIG. 16a shows the curve of the impedance Zs of the serial resonator and of the admittance Yp of the parallel resonator, plotted over the frequency f. FIG. 16b shows the passband response of a filter made up of a basic element, whose resonance frequencies are selected as in FIG. 16a. FIG. 7 shows a basic element that is to be regarded in principle as a two-port network having terminals 3-1 or 3-2 as a port 1 and having terminals 3-3 or 3-4 as a port 2. At the same time, terminal 3-1 is the input and terminal 3-3 is the output of the series resonator. The input of the parallel resonator is connected with terminal 3-1. Terminals 3-2 and 3-4 represent the reference ground, given asymmetrical operation. The output 3-5 of parallel resonator R1, which faces the reference ground, is designated in the following as the output or ground side of the parallel resonator. The inductance $L_{ser}$, which is situated between the output side of the parallel resonator and the reference ground, reflects the connection to the housing ground in the real construction.

The selection level of a reactance filter constructed from BAW resonators is determined on the one hand by the ratio $C0_p/C0_s$ of the static capacitance COP in the parallel branch and the static capacitance $C0_s$ in the series branch, and on the other hand by the number of basic elements that are cascaded, i.e., connected in series with one another.

A plurality of basic elements can be wired together in matched fashion, whereby the structure of each of the second adjacent basic elements is mirrored. The output impedance of the first basic element (7-1 in FIG. 2, or 8-1 in FIG. 3) is then equal to the input impedance of the second basic element (7-2 in FIG. 2 or 8-2 in FIG. 3), so that only minimal losses are produced by mismatching. Many structures are known for the wiring of a plurality of basic elements. Some examples are shown in FIGS. 4 and 5.

Resonators of the same type (series resonators or parallel resonators) that are situated immediately one after the other in a circuit of a reactance filter can also be respectively combined to form a resonator, whereby the overall capacitive effect of the combined resonator remains constant.

From equations (1.2) to (1.4), it can be seen that both the maximum achievable bandwidth and also the steepness of the edges of such a reactance filter depend on the difference of the resonance and anti-resonance frequencies of the individual resonators. This difference in turn results from the ratio of dynamic capacitance C1 and static capacitance C0. Because these capacitances are proportional to one another, the capacitance ratio C1/C0 does not change when one of these capacitances is altered. For example, C0 could be varied by changing the size of the resonator. As a rule, all resonators of a reactance filter have the same relative bandwidth (fa−fr)/f0.

Curve 1 in FIG. 6 shows the passband response of a reactance filter that is constructed from uniform BAW resonators, with each resonator having a relatively large ratio of dynamic to static capacitance. The individual resonators thus have a relatively large bandwidth. Curve 2 is the passband curve of a corresponding reactance filter made up of resonators having a small ratio of dynamic to static capacitance, and thus a relatively low bandwidth of the individual resonators. In the first case (curve 1), a bandpass filter is obtained having a high bandwidth and a low edge steepness, while in the second case (curve 2) a bandpass filter is obtained having a low bandwidth and a high edge steepness.

If it is now attempted, in such a steep-edged filter, to increase the bandwidth to the level of the filter having the larger capacitance ratio by increasing the center frequencies of series resonators and/or reducing the center frequency of the parallel resonators, a strong mismatching results in the center of the passband, because now $f_{ap} \ll f_{rs}$. Condition (1.4) is thus no longer fulfilled. For this reason, the losses in the center of the passband also increase more strongly.

Another possibility for broadening a steep-edged filter consists in a reduction of the ratio ($C0_p/C0_s$) of the static capacitance $C0_p$ in the parallel branch and the static capacitance $C0_s$ in the series branch. In this way, the bandwidth can be enlarged to a certain extent without losing the self-matching and the small losses connected therewith. However, with this measure the selection level of the BAW reactance filter is strongly reduced, so that the filter can no longer meet possible selection demands, and can for example no longer sufficiently attenuate undesired frequencies.

SUMMARY OF THE INVENTION

The object of the present invention is therefore to provide a reactance filter constructed from BAW resonators that has an improved edge steepness with sufficient bandwidth, without having to accept an additional matching or a reduction of the selection level for this purpose.

This object is achieved according to the present invention by a reactance filter constructed from resonators of the BAW type, the filter comprises at least one basic element having a first resonator in a first branch and a second resonator in a second branch, one of the branches being a serial branch and the other branch being a parallel branch, each resonator having a specific ratio $V_C=C1/C0$ of a dynamic to static capacitance, the ratio $V_C$ for the resonator of the second branch is set smaller than the ratio for the first branch.

The present invention exploits the fact that for the RF filters in many mobile radiotelephone systems, high demands are placed only on the band demarcation from the corresponding other duplex band. That is, as a rule an RF filter requires a steep edge only on the side of the passband facing the other duplex band. In the currently standard mobile radiotelephone systems based on GSM, CDMA, AMPS, or TDMA, in the case of a receive filter this is the left edge, while in the case of a transmit filter it is the right edge.

The present invention makes use of this fact, and indicates a reactance filter that is constructed from resonators of the BAW type. It comprises at least one basic element having a first resonator in a first branch and having a second resonator in a second branch that are connected parallel to one another, one of the branches being the serial branch while the other branch is a parallel branch. Each of the resonators has a specific ratio $V_C$ of dynamic capacitance C1 to static capacitance C0:

$$V_C = C1/C0$$

whereby according to the present invention the ratio $V_C$ for the resonator of a first branch is set lower than for the resonator of the second branch. Dependent on the branch in which the ratio $V_C$ has been set lower, the reactance filter according to the present invention has a passband response having an improved edge steepness for one edge. The other edge, as well as the remaining resonator and filter characteristics, remain unaffected by this change. If, for example, in a resonator in the serial branch the ratio $V_C$ is reduced in relation to the corresponding ratio $V_C$ in the resonator of the parallel branch, the right edge of the passband is set steeper, i.e., the edge that demarcates the passband from higher frequencies. Analogously, in a reactance filter in which the resonator in the parallel branch has a smaller ratio $V_C$ than does the resonator in the serial branch, a passband is obtained having a left edge that is set steeper. Because, in a basic element of a reactance filter, the resonance and anti-resonance frequencies of the parallel resonator are lower than the corresponding frequencies of the serial resonator, for example the right edge of the passband is determined by the characteristics of the serial resonator. The steepness of the right edge can be seen in the speed with which the impedance curve of the serial resonator climbs from the resonance frequency to the anti-resonance frequency. A steeper impedance increase in a (serial) resonator is obtained when the distance between the resonance and the anti-resonance frequency of the resonator is reduced. Because, conversely, the steepness of the left edge is determined essentially by the parallel resonator or by the resonator in the parallel branch, a steeper setting of the left edge is achieved through a reduction of the distance between the resonance and anti-resonance frequency of the parallel resonator.

Because as a rule a real reactance filter is obtained by wiring a plurality of basic elements together, a reactance filter standardly comprises a plurality of serial resonators and a plurality of parallel resonators. A reactance filter according to the present invention is then already obtained when the cited modifications have been carried out in a single resonator of one type (serial or parallel). A further improved, even steeper edge is obtained if a plurality of resonators of one type, preferably all resonators of one type, have a smaller distance between the resonance and anti-resonance frequency. Through the given dependence of the corresponding quantities on one another, this distance increases with the cited ratio $V_C$ of the dynamic to the static capacitance. A resonator having such a reduced distance is designated a narrowband resonator. A resonator having a correspondingly larger distance of the resonance and anti-resonance frequency is designated a broadband resonator.

Independent of the use of at least one narrowband resonator for a first branch, the broadbandedness of the filter, i.e., the width of the passband, is achieved in that broadband resonators are used in the second branch.

With a filter according to the present invention, having for example an improved, steeper right edge, a higher selection is achieved at frequencies that are somewhat higher than the highest frequency of the passband. This is for example advantageous in a filter that is used in current GSM-based or CDMA-based mobile radiotelephone systems as the filter in the transmission path, which must provide a high degree of suppression of the receive band.

Conversely, a filter according to the present invention, having for example an improved, steeper left edge, is achieved through narrowband parallel resonators resulting in a high selection at frequencies that are somewhat lower than the lowest frequency of the passband of the filter. Such filters are preferably used as filters in the receive path of current GSM-based or CDMA-based mobile radiotelephone systems, which must provide a high degree of suppression of the transmit band.

Via the known connection, according to the following equation, of the effective coupling coefficient $K^2_{eff}$ with the position of the resonance and anti-resonance frequency:

$$K_{eff}^2 = (\pi/2)^2 \times \frac{fa - fr}{fa}. \quad (1.5)$$

It results that a narrowband resonator can also be achieved through the direct influencing of the effective coupling coefficient $K^2_{eff}$. A narrowband resonator can be realized on a suitable piezoelectric material having a lower effective electromechanical coupling coefficient. This effective electromechanical coupling coefficient is in turn obtained from the sum of the effective couplings of all modes capable of propagation in a piezoelectric material.

Because as a rule a real filter uses only one mode, while in contrast the center frequencies of the remaining modes are at a sufficient distance from the passband, the effective coupling (for the mode used) can be determined from the equivalent circuit diagram of a BAW resonator according to the following equation:

$$k_{eff}^2 \approx \frac{C1}{C_1 + C_0}. \quad (1.6)$$

From this formula there results the dependence of the narrowbandedness of a resonator on the ratio of the dynamic to static capacitance of a resonator, or, precisely stated, on the ratio of dynamic to static capacitance of the relevant oscillation mode, or the oscillation mode that is in use, of the resonator. From this consideration it results that a BAW resonator having a smaller ratio $V_C$ has a lower effective coupling $k^2_{eff}$. If for the construction of a resonator a piezomaterial is used having a small coupling coefficient, and thus low effective coupling, a resonator is obtained having a small distance between the resonance frequency and the anti-resonance frequency. Given the use of a higher-coupling piezomaterial, a resonator is obtained having a greater distance between the resonance frequency and the anti-resonance frequency.

A reactance filter according to the present invention therefore has, for example, resonators having a higher-coupling piezomaterial in the series branch of the reactance filter, and, in contrast, resonators having lower-coupling piezomaterial in the parallel branch of the same filter. Such a filter then has a high steepness of the left edge. At the same time, the reactance filter according to the present invention has a high bandwidth, ensured by the relatively great distance between the resonance frequencies and the anti-resonance frequency in the series resonators.

Moreover, in a reactance filter having BAW resonators the effective coupling can be reduced, when an additional layer which is made of a non-piezoelectric material is inserted between the two electrodes of a BAW resonator. Here the coupling coefficient is reduced by the ratio of the layer thickness of the non-piezoelectric material to the overall layer thickness of the resonator. In any case, with such a layer, a reduction of the effective coupling is obtained that for the filter or the resonator is equivalent to a reduction of the ratio $V_C$, and thus is also equivalent to a reduction of the distance between the resonance and the anti-resonance frequency.

Another possibility for affecting the effective coupling consists in the selection of suitable electrode materials for the BAW resonators. A high electromechanical coupling is achieved using an electrode material that effects a high mechanical impedance of the electrode for the mode used. An electrode material that increases the effective coupling (for the relevant or employed mode in the resonator) is obtained dependent on the position of the electrode metal in the periodic table of the elements, or is determined as an empirical value. A reactance filter according to the present invention therefore has for example resonators that in a first branch use an electrode material that differs from the electrode material of the resonators in the second branch. For example, through the use of a heavy electrode material, such as for example tungsten, the effective coupling is increased, whereby a resonator is obtained that is more broadbanded in comparison with a resonator having aluminum electrodes. A reactance filter having resonators having tungsten electrodes in a first branch and having resonators having aluminum electrodes in a second branch accordingly has a more narrowband resonator in the second branch. If the second branch is a parallel branch, the left edge of the passband of the reactance filter is improved. If the correspondingly narrowbanded resonator is used in the serial branch, the right edge is improved in the reactance filter.

A BAW filter is preferably surrounded by air on both sides of the electrodes. For this purpose, in the technical realization two support points situated at a large distance from one another are provided for an electrode layer; here one speaks of what are called bridge resonators. In these bridge resonators, the acoustic wave is reflected on both sides of the resonator at the solid element/air transition. However, it is also possible to construct a BAW resonator in such a way that one of the electrodes is situated with its entire surface on a substrate. The reflection of the acoustic wave can then be ensured using an acoustic mirror, which can for example be realized by two layers having different acoustic impedance, with each layer having a layer thickness of $\lambda/4$ in relation to the wavelength $\lambda$ of the acoustic wave inside the layer material. The repeated reflections at the transitions of the two layers having sharply differing acoustic impedances then results in the extinguishing of wave portions reflected at different boundary surfaces, which in turn means a high degree of reflection for the mirror.

However, in the use of a resonator having an acoustic mirror a part of the mechanical energy of the resonator is located outside the electrodes. Within the layer sequence electrode/piezomaterial/electrode, the ratio of the electrical to the mechanical energy therefore changes, and thus the effective coupling, measured according to the following equation, also changes:

$$k_{eff}^2 \approx \frac{u_E}{u_E + u_M}. \quad (1.7)$$

Here $u_E$ denotes the electrical energy density, and $u_M$ denotes the mechanical energy density. From this equation, it clearly follows that the effective coupling of a resonator having an acoustic mirror is reduced in relation to a bridge resonator by the amount $u_M$. This means that resonators having an acoustic mirror have a lower effective coupling, and thus a smaller distance between the resonance and anti-resonance frequency, than do bridge resonators. A reactance filter according to the present invention therefore has bridge resonators for example in the parallel branch, and in contrast has in the serial branch resonators having an acoustic mirror, whereby a bandpass response is obtained having a steeper passband in the right edge.

It is also possible to influence the effective coupling $k^2_{eff}$ of a resonator through the use of different acoustic mirrors. This can take place through the use of mirror layers having different thicknesses, or through the use of mirror layers having different material. A reactance filter according to the present invention is then distinguished by resonators using, in a first branch, acoustic mirrors that are at least partly different than those used in a second branch.

In the following, the present invention is explained in more detail on the basis of exemplary embodiments and the associated Figures.

BRIEF DESCRIPTION OF THE DRAWINGS

FIGS. 1a to 1c show a BAW resonator with FIG. 1a being a schematic cross-sectional view, FIG. 1b being an equivalent circuit diagram thereof, and FIG. 1c illustrating a substitute symbol used for a resonator.

FIGS. 2 and 3 show circuit diagrams for two possibilities for the wiring of two basic elements to form a filter.

FIGS. 10 and 11 are graphs showing the bandpass responses of reactance filters according to the present invention.

FIG. 12 is a graph showing the impedance curves of resonators having different electrode materials.

DESCRIPTION OF THE PREFERRED EMBODIMENTS

First Exemplary Embodiment

Resonators constructed as in FIG. 1a are wired together to form a reactance filter (see FIG. 1b). Each resonator comprises a first electrode layer E1, a piezoelectric layer P and a second electrode layer E2 (FIG. 1a). In FIG. 1c, the symbol standardly used for resonators is shown.

Figure 3:
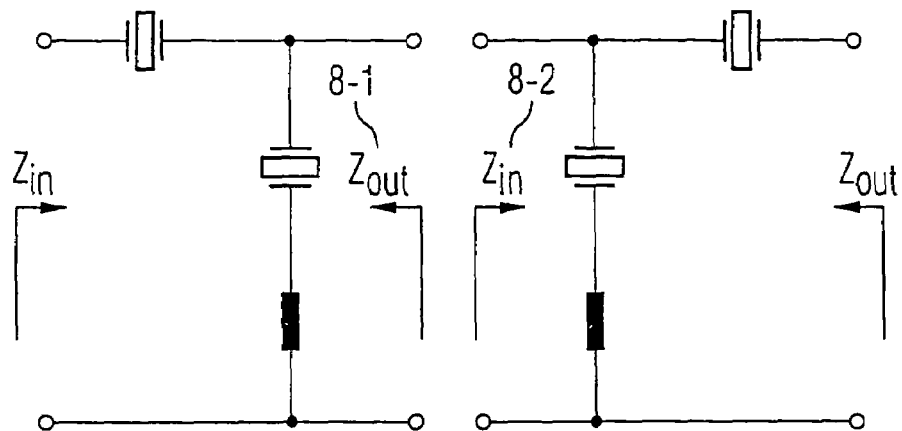
Figure 4:
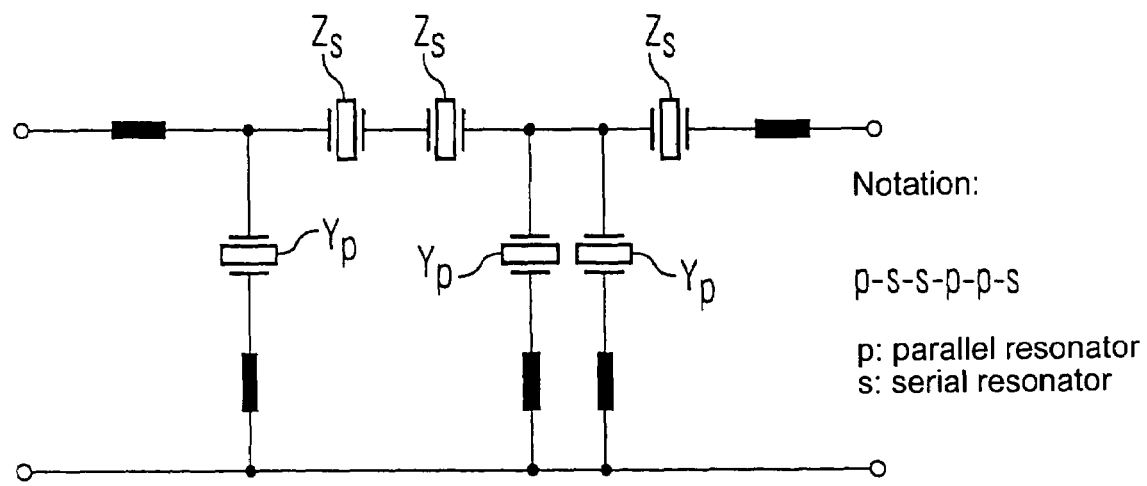
FIG. 4 shows a circuit diagram for a reactance filter having three basic elements.
Figure 5:
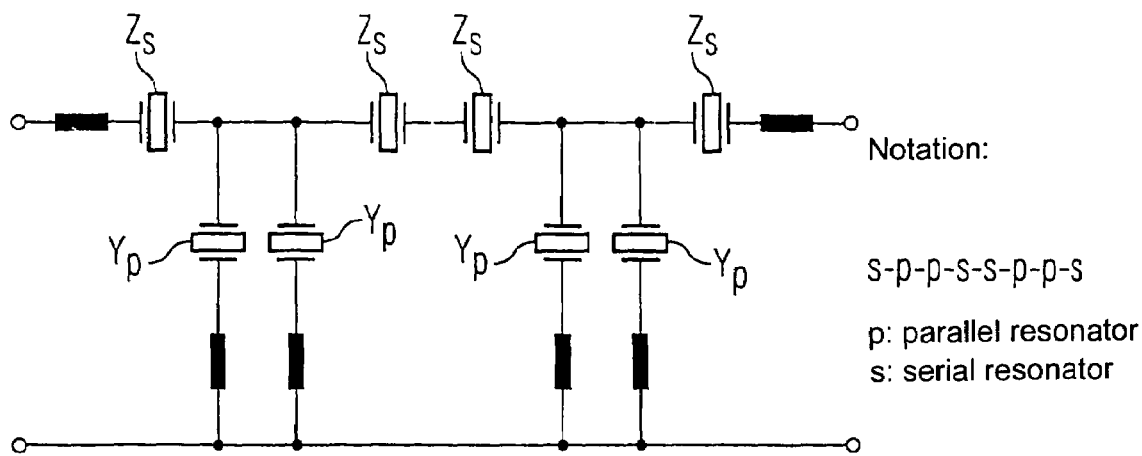
FIG. 5 shows a circuit diagram for a reactance filter having four basic elements.
Figure 6:
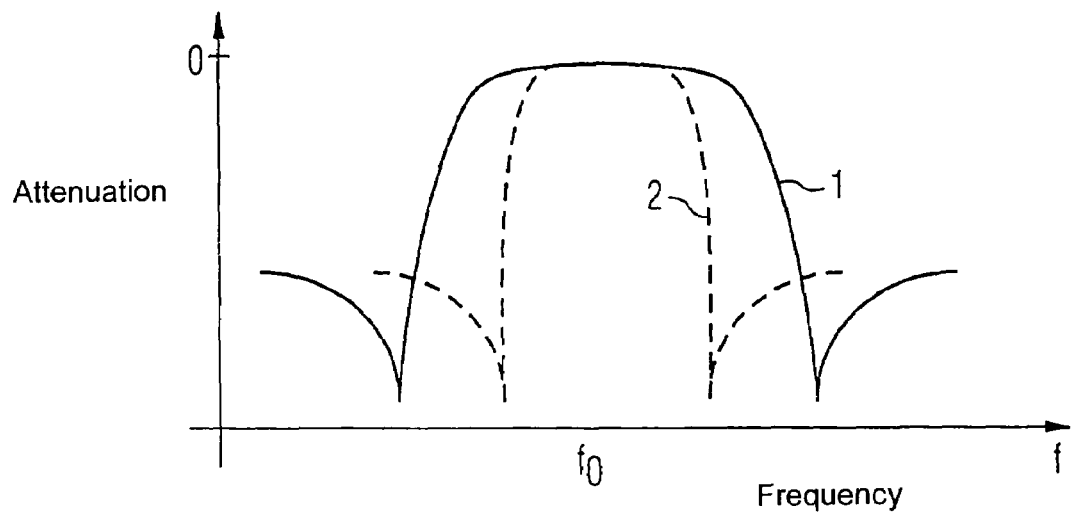
FIG. 6 is a graph showing the attenuation curves for a broadband filter and for a narrowband filter.
Figure 7:
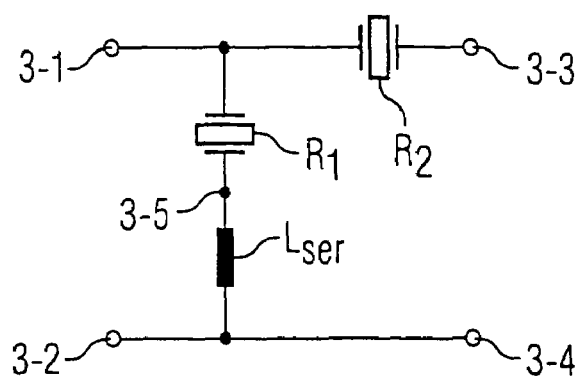
FIG. 7 shows a circuit diagram for a basic element of a reactance filter, constructed from BAW resonators.
Figure 8:
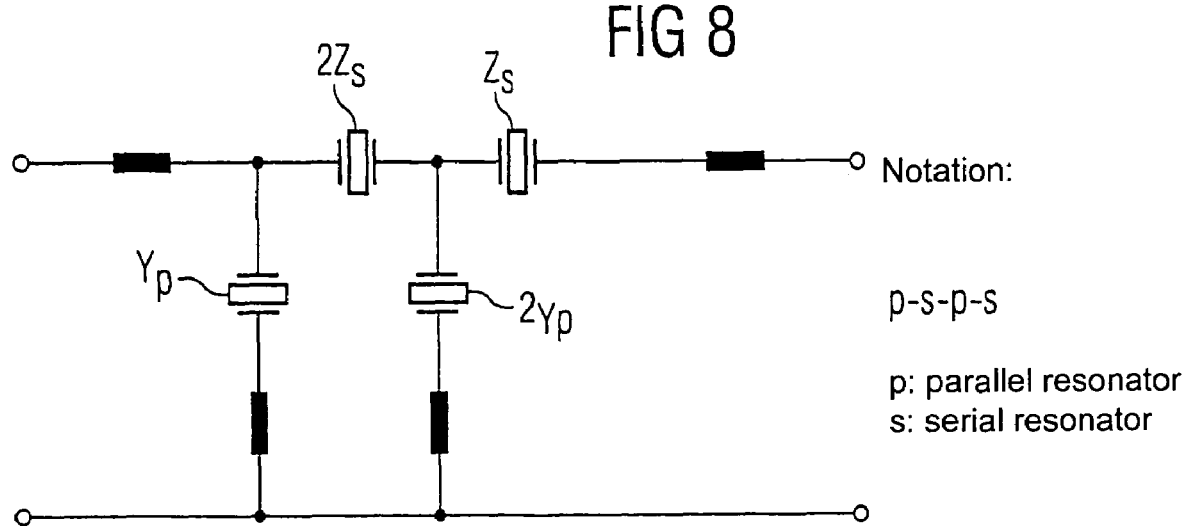
FIG. 8 shows a circuit diagram for a simplified filter structure having three basic elements.
Figure 9:
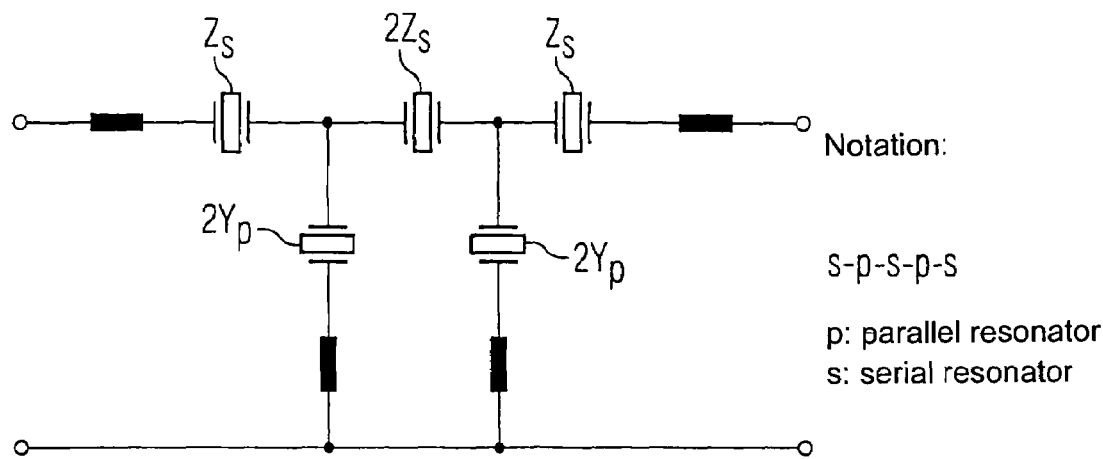
FIG. 9 shows a circuit diagram for the same filter having a simplified structure.

FIG. 7 shows a basic element constructed from a first resonator R1 in a parallel branch and a second resonator R2 in a serial branch. Terminals 3-1 and 3-2 form the input of the filter, and terminals 3-3 and 3-4 form the output of the filter. The parallel branch, or resonator R1 in the parallel branch, is connected with terminals 3-2 or 3-4 via a series inductance $L_{ser}$, formed from the sum of the inductances of the connection to the housing ground. According to the present invention, in this exemplary embodiment resonator R1 is formed with a piezoelectric layer P made of zinc oxide, which has an electromechanical coupling constant $K^2_{eff} 1$, and resonator R2 is formed with a piezoelectric layer P made of aluminum nitride, which has a piezoelectric coupling constant $K^2_{eff} 2$, such that $K^2_{eff} 1 > K^2_{eff} 2$. Via the respective thickness of the piezoelectric layer, or the thickness of the overall resonator, the resonance frequencies, and thus also the anti-resonance frequencies, of the two resonators R1 and R2 are set such that the resonance frequency of R2 is approximately equal to the anti-resonance frequency of R1.

Figure 10:
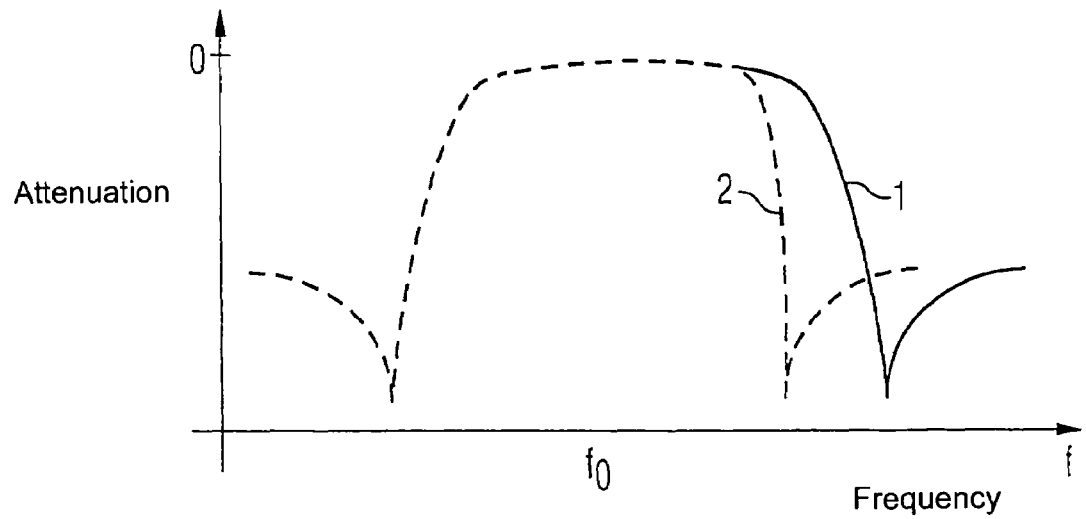

Passband curve 2 in FIG. 10 shows the attenuation characteristic of a reactance filter according to this exemplary embodiment of the present invention, presented in comparison with passband curve 1 of a conventional reactance filter, in which both resonators use zinc oxide for the piezoelectric layer P of the resonators. It can be seen that the right edge of curve 2 is set significantly steeper than that of the known filter. The bandwidth of the overall filter is reduced only insignificantly.

Second Exemplary Embodiment

Again, a reactance filter is constructed having a basic element wired according to FIG. 2, and both resonators are fashioned as in FIG. 1. In contrast to the first exemplary embodiment, both resonators do comprise the same piezoelectric material for the layer P, but differ in the electrode material used for electrodes E1 and E2. While aluminum is used for resonators R1, tungsten is used as the electrode material for resonators R2. Because $k^2_{eff} 2 > k^2_{eff} 1$ holds for the effective coupling $k^2_{eff}$, as a result a reactance filter is obtained whose passband curve 2 is shown in FIG. 11. It can be seen that curve 2 of the filter according to the present invention has a left edge that is set significantly steeper than the left edge of curve 1, which shows the passband response of a known reactance filter in which the same electrode material (tungsten) was used for both resonators.

FIG. 12 shows the influence of the electrode material on the impedance characteristic of a resonator. Curves 3 and 4 show the impedance characteristic of resonators fashioned according to FIG. 1, whereby curve 3 shows the impedance of a resonator having aluminum electrodes while curve 4 shows the impedance characteristic of a resonator having tungsten electrodes. It can be seen that the greater effective coupling of tungsten electrodes according to curve 4 results in a greater distance of the resonance frequency from the anti-resonance frequency.

Third Exemplary Embodiment

Figure 13:
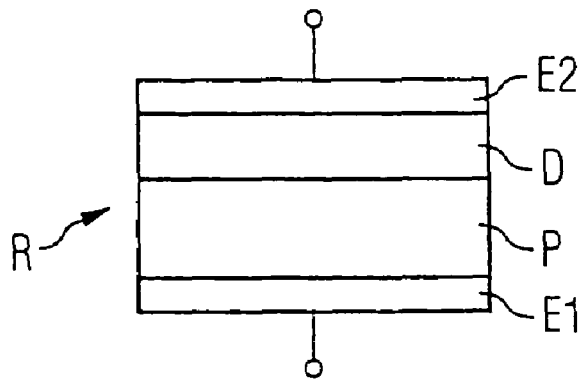
FIG. 13 is a cross-sectional view of a resonator having an additional dielectric layer.

A resonator is formed according to FIG. 13. This resonator comprises, between a first electrode E1 and a second electrode E2, made for example of aluminum, a piezoelectric layer P made for example of aluminum nitride, as well as a dielectric layer D, made for example of silicon oxide. If the layer portion of the silicon oxide layer is 16%, the coupling coefficient $k^2_{eff}$ decreases from a value of 0.0645, determined in a resonator according to FIG. 1 having aluminum nitride as a piezoelectric layer, to a value of 0.057 for the resonator according to the present invention, as shown in FIG. 13. This latter resonator therefore has a smaller distance between the resonance and the anti-resonance frequency, and can be used in combination with conventional resonators (see FIG. 1), whereby in the reactance filter (for example according to FIG. 7) the serial and parallel resonators are formed differently, i.e., respectively according to FIG. 1 or FIG. 13.

Fourth Exemplary Embodiment

Figure 14:
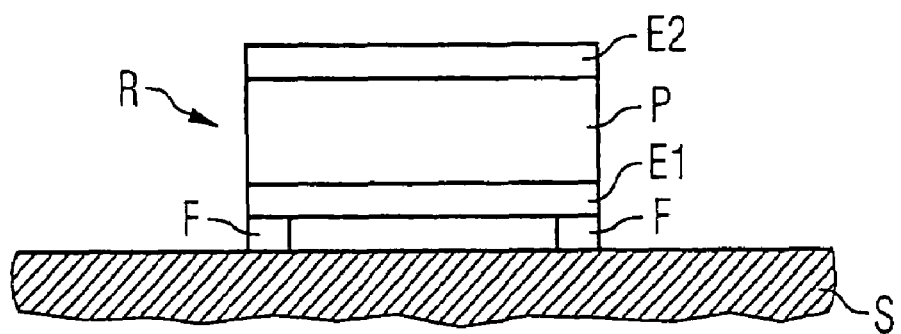
FIG. 14 is a cross-sectional view of a bridge resonator in schematic cross-section.

FIG. 14 shows a BAW resonator formed as a bridge resonator. This resonator has a basic element corresponding to FIG. 1, but is however connected with a substrate S via two socket structures F. Because the predominant part of the lower electrode E1 of the resonator has air as a boundary surface, this bridge resonator behaves approximately as a resonator that can oscillate completely freely. At the two boundary surfaces E1/air or E2/air, total reflection of the acoustic wave thereby takes place.

Figure 15:
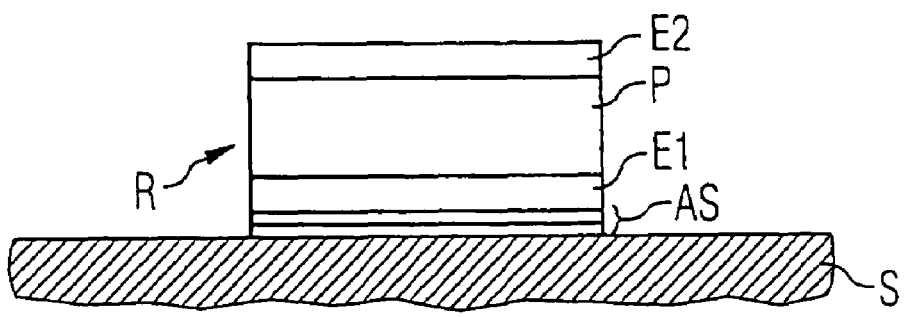
FIG. 15 is a cross-sectional view of a BAW resonator having an acoustic mirror.
Figure 16A:
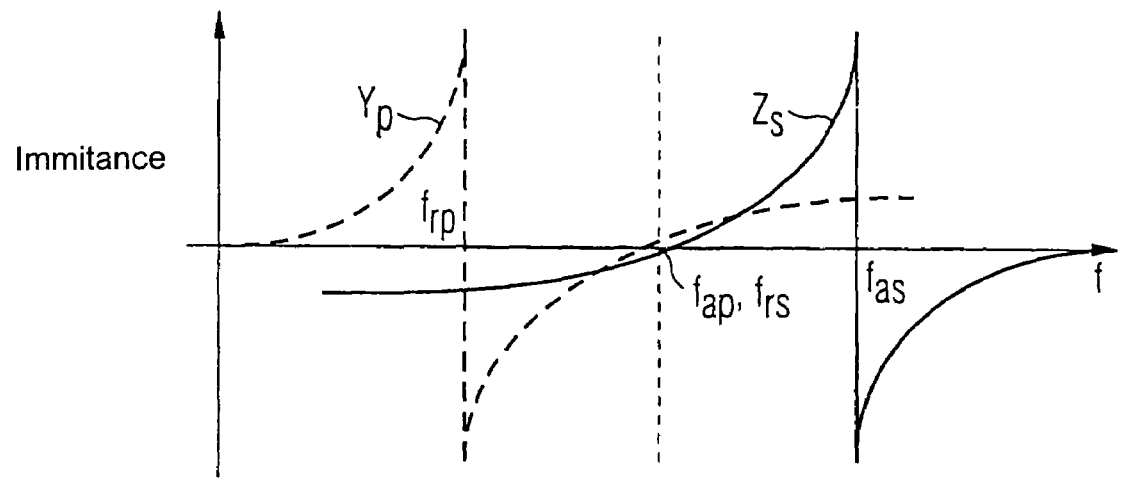
FIGS. 16a and 16b are graphs with FIG. 16a showing superimposed admittance and impedance curves for individual resonators, and FIG. 16b showing the attenuation characteristic of a reactance filter.
Figure 16B:
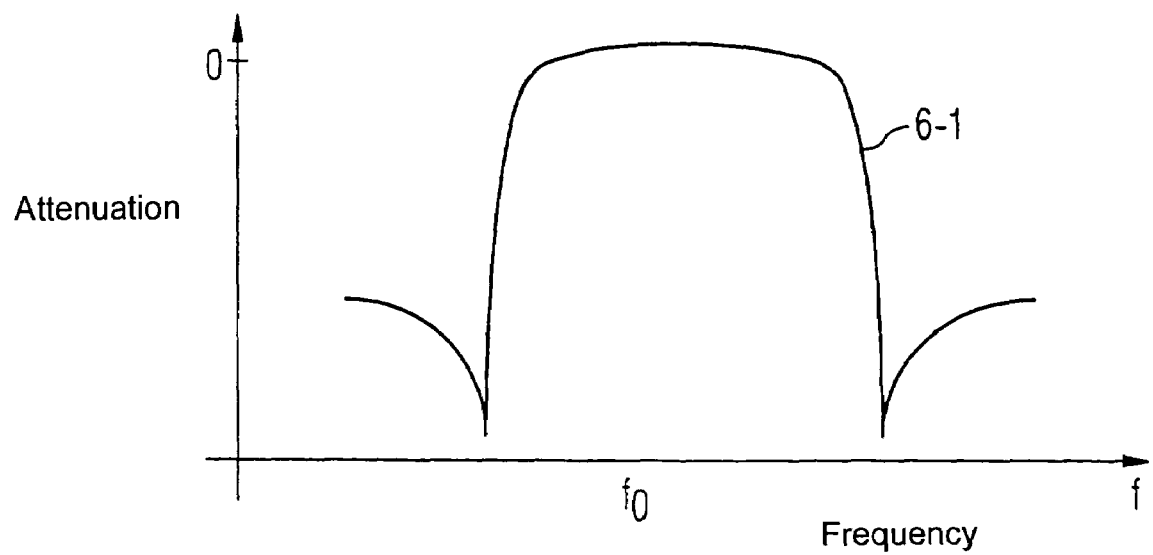

FIG. 15 shows a resonator that is situated on a substrate S with the aid of an acoustic mirror AS.

A reactance filter according to the present invention is now manufactured from at least one basic element (for example according to FIG. 7), whereby in a first branch, resonators having a bridge construction are used, while, in contrast, in a second branch, resonators having an acoustic mirror are used. Because the effective coupling coefficient for resonators according to FIG. 14 is greater than for resonators according to FIG. 15, the passband edge allocated to the branch having the resonators with the acoustic mirror can be formed more steeply. If for example resonators R1 are realized with an acoustic mirror, and resonators R2 are constructed as bridge resonators, a steeper left edge is obtained in the passband response of the reactance filter constructed in this way.

Although the present invention has been presented and explained only on the basis of a few exemplary embodiments, it is of course not limited to these. Possible constructions of the present invention relate to additional methods for varying the bandwidth of an individual resonator, and correspondingly to the use of resonators having different bandwidths in inventive filters. The variations can thereby comprise individual resonators in one branch, individual resonators in both branches, all resonators in one branch, or all resonators in both branches.

I claim:

1. A reactance filter comprising at least one basic element having a first resonator in a first branch and a second resonator in a second branch, one of the branches being a serial branch and the other branch being a parallel branch, each resonator being of a BAW type having a specific ratio $V_C=C1/C0$ of dynamic to static capacitance and the ratio $V_C$ for the resonator of the second branch being set smaller than the ratio $V_C$ for the resonator of the first branch.

2. A reactance filter according to claim 1, wherein the resonator of the first branch is made of a first piezoelectric material and the resonator of the second branch is made of a second piezoelectric material differing therefrom, each piezoelectric material having a coupling coefficient with the coupling coefficient of the first piezoelectric material being higher than the coupling coefficient of the second piezoelectric material.

3. A reactance filter according to claim 1, wherein the electrode materials for the resonators of the first and second branch are different, with the electrode material for the resonators of the first branch producing a higher effective coupling than the electrode material of the resonators of the second branch.

4. A reactance filter according to claim 1, in which the BAW resonators of the second branch include, besides a layer of a piezoelectric material, another layer of an additional material that has a lower dielectric constant than the piezoelectric material between the two electrodes.

5. A reactance filter according to claim 1, wherein at least the resonators of the second branch include an acoustic mirror underneath an electrode layer and wherein the effective coupling coefficient for the resonators of the second branch is lowered in relation to the coupling coefficient of the resonators of the first branch.

6. A reactance filter according to claim 5, wherein the resonators of the first and second branch have acoustic mirrors that are different with respect to one of the layer thicknesses of the mirror layers, the reflection characteristics in the two branches and the layer thickness of the mirror layer and reflection characteristics.

7. A reactance filter according to claim 5, wherein only the resonators of the second branch have an acoustic mirror, and the resonators of the first branch have a different method for the reflection of acoustic waves.

8. A reactance filter according to claim 1, wherein each branch has a plurality of basic elements wired with one another, with the basic elements of the serial branch being connected to one another in series, and the elements of the parallel branch being connected in parallel.

9. A reactance filter according to claim 8, wherein the ratio $V_C=C1/C0$ of dynamic to static capacitance in at least one resonator of the serial branch is set to a different value than the corresponding ratio of the resonators in the parallel branches.

10. A reactance filter according to claim 1, wherein to obtain a passband response having a passband with a steeper left edge, the ratio $V_C=C1/C0$ of dynamic to static capacitance is lowered in at least one resonator of the parallel branches in relation to the ratio for the resonators of the serial branch.

11. A reactance filter according to claim 1, wherein to obtain a passband response having a passband with a steeper right edge, the ratio $V_C=C1/C0$ of dynamic to static capacitance in at least one resonator of the serial branch is lowered in relation to the ratio for the resonators of the parallel branches.

12. A reactance filter according to claim 1, wherein the resonators of the parallel branches are connected in series with an inductance, and are respectively connected individually with a ground terminal.

13. A wireless communication system having a transmit part and a receiver part, each part having a reactance filter comprising at least one basic element having a first resonator in a first branch and a second resonator in a second branch, with one of the branches being a serial branch and the other branch being a parallel branch, each resonator being a BAW type having a specific ratio $V_C=C1/C0$ of a dynamic to static capacitance and the ratio $V_C$ for the resonator of the second branch being set smaller than the ratio of the ratio $V_C$ for the resonator of the first branch, the filter for the transmit part having the second branch being a serial branch and the first branch being the parallel branch, so that the filter has a steeper right edge, and the filter for the receive part having the second branch being the parallel branch and the first branch being the serial branch, so that the filter has a steeper left edge.

14. A duplexer having two passband filters, each passband filter being a reactance filter comprising at least one basic element having a first resonator in a first branch and a second resonator in a second branch, one of the branches being a serial branch and the other branch being a parallel branch, each resonator being of a BAW type having a specific ratio $V_C=C1/C0$ of a dynamic to static capacitance and the ratio $V_C$ for the resonator of the second branch being smaller than the ratio $V_C$ for the resonator of the first branch, one of the passband filters having a low center frequency and being a reactance filter, with the second branch being a serial branch and the first branch being a parallel branch, so that it has a steeper right edge and the other of the two passband filters having a high center frequency and being a reactive filter with the second branch being a parallel branch and the first branch being a serial branch, so that the other filter has a steeper left edge.

* * * * *